(12) United States Patent
Solihin

(10) Patent No.: US 9,275,696 B2
(45) Date of Patent: Mar. 1, 2016

(54) ENERGY CONSERVATION IN A MULTICORE CHIP

(75) Inventor: Yan Solihin, Poway, CA (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 442 days.

(21) Appl. No.: 13/812,967

(22) PCT Filed: Jul. 26, 2012

(86) PCT No.: PCT/US2012/048282
§ 371 (c)(1),
(2), (4) Date: Jan. 29, 2013

(87) PCT Pub. No.: WO2014/018038
PCT Pub. Date: Jan. 30, 2014

(65) Prior Publication Data
US 2014/0032829 A1    Jan. 30, 2014

(51) Int. Cl.
G06F 12/00    (2006.01)
G11C 7/10    (2006.01)
G11C 11/406    (2006.01)
G06F 12/08    (2006.01)
G06F 11/10    (2006.01)

(52) U.S. Cl.
CPC .......... *G11C 7/1072* (2013.01); *G06F 11/1064* (2013.01); *G06F 12/0813* (2013.01); *G06F 12/0817* (2013.01); *G11C 11/40622* (2013.01); *G06F 2212/1028* (2013.01); *G06F 2212/403* (2013.01); *Y02B 60/1228* (2013.01)

(58) Field of Classification Search
CPC . G06F 1/3275; G06F 1/3203; G06F 12/0817; G06F 12/0893; G06F 2212/1028
See application file for complete search history.

(56) References Cited

U.S. PATENT DOCUMENTS

| 6,012,127 | A * | 1/2000 | McDonald et al. ........... 711/141 |
| 2002/0124143 | A1* | 9/2002 | Barroso et al. ................ 711/145 |
| 2004/0030838 | A1 | 2/2004 | van de Waerdt |
| 2006/0005053 | A1 | 1/2006 | Jones, Jr. et al. |
| 2009/0210774 | A1* | 8/2009 | Godard et al. ................ 714/801 |
| 2010/0082905 | A1 | 4/2010 | Wilkerson et al. |
| 2010/0180084 | A1* | 7/2010 | Cypher ........................ 711/135 |
| 2010/0274971 | A1 | 10/2010 | Solihin |
| 2011/0093654 | A1* | 4/2011 | Roberts et al. ................ 711/105 |
| 2011/0134708 | A1 | 6/2011 | Klein |

(Continued)

OTHER PUBLICATIONS

Ganssle, "Embedded Hardware: Know it All", Newnes Know it All Series, 2008, ,p. 106.*

(Continued)

*Primary Examiner* — Yong Choe
*Assistant Examiner* — Arvind Talukdar
(74) *Attorney, Agent, or Firm* — Turk IP Law, LLC

(57) ABSTRACT

Technologies are described herein for conserving energy in a multicore chip via selectively refreshing memory directory entries. Some described examples may refresh a dynamic random access memory (DRAM) that stores a cache coherence directory of a multicore chip. More particularly, a directory entry may be accessed in the cache coherence directory stored in the DRAM. Some further examples may identify a cache coherence state of a block associated with the directory entry. In some examples, refresh of the directory entry stored in the DRAM may be selectively disabled based on the identified cache coherence state of the block such that energy associated with the multicore chip is conserved.

23 Claims, 8 Drawing Sheets

(56) References Cited

U.S. PATENT DOCUMENTS

2011/0138252 A1 6/2011 Pawlowski et al.
2011/0161595 A1 6/2011 Fang et al.

OTHER PUBLICATIONS

International Search Report & Written Opinion dated Nov. 8, 2012 in PCT Application No. PCT/US12/48282.
Black, B. et al., "Die Stacking (3D) Microarchitecture," The 39th Annual IEEE/ACM International Symposium on Microarchitecture (MICRO'06).
Borkar, S. et al., "The Future of Microprocessors," Communications of the ACM, vol. 54 No. 5, pp. 67-77 [http://cacm.acm.org/magazines/2011/5/107702-the-future-of-microprocessors/fulltext], May 2011.
Yamauchi, T. et al., "A Single Chip Multiprocessor Integrated with DRAM," Workshop on Mixing Logic and DRAM, held at the 24th International Symposium on Computer Architecture. 1997.
Conway, P. et al., "Cache Hierarchy and Memory Subsystem of the AMD Opteron Processor", IEEE Micro, Mar./Apr. 2010.

\* cited by examiner

ENERGY CONSERVATION IN A MULTICORE CHIP

CROSS-REFERENCE TO RELATED APPLICATION

This Application is the National Stage filing under 35 U.S.C §371 of PCT Application Ser. No. PCT/US12/48282 filed on Jul. 26, 2012. The PCT Application is herein incorporated by reference in its entirety.

BACKGROUND

Unless otherwise indicated herein, the materials described in this section are not prior art to the claims in this application and are not admitted to be prior art by inclusion in this section.

A directory can refer to a storage structure used by cache coherence protocols to keep track of which caches store copies of memory blocks. Tracking can be utilized to ensure correct operation of operating systems and application programs. Unlike cache size, which can grow linearly with the number of cores, the size of the directory can grow quadratically with the number of cores. More specifically, the directory can grow vertically, having more entries to track additional memory blocks that may be cached in the system, as well as horizontally, having more bits to track the increased number of sharers per block. Thus, the directory size can grow much faster than the number of cores or the cache size of each core.

Conventional directory implementations may utilize static random access memory (SRAM). Due to increasing demands on directories resulting from an increasing number of cores on chip, future directory implementations may utilize dynamic random access memory (DRAM) instead of SRAM. However, DRAM can suffer power leaks, and a significant amount of power can be consumed in order to address such power leaks.

SUMMARY

The present disclosure generally describes technologies configured to conserve energy in a multicore chip via selective refresh of memory directory entries. Some example methods may refresh a dynamic random access memory (DRAM) that stores a cache coherence directory of a multicore chip. Example methods may access a directory entry in the cache coherence directory stored in the DRAM. Example methods may identify a cache coherence state of a block associated with the directory entry. Example methods may selectively disable a refresh of the directory entry stored in the DRAM based on the identified cache coherence state of the block such that energy associated with the multicore chip is conserved.

The present disclosure generally also describes some example computer-readable storage media having computer-executable instructions stored thereon which, when executed by a computing device, cause the computing device to perform one or more operations adapted to refresh a DRAM that stores a cache coherence directory of a multicore chip. Some example operations may access a directory entry in a cache coherence directory of a multicore chip stored in a DRAM. Example operations may identify a cache coherence state of a block associated with the directory entry. Example operations may selectively disable a refresh of the directory entry stored in the DRAM based on the identified cache coherence state of the block such that energy associated with the multicore chip is conserved.

The present disclosure generally further describes some example multicore chips. Example multicore chips may include multiple processor cores and multiple cache memories. Each cache memory of the multiple cache memories may correspond to one or more of the processor cores. Example multiple chips may also include a directory stored in DRAM. The directory may include a directory entry. Example multicore chips may further include a directory controller configured to perform one or more operations. Some example operations may access the directory entry in the directory. Example operations may identify the cache coherence state of the block associated with the directory entry. Example operations may selectively disable a refresh of the directory entry based on the identified cache coherence state of the block such that energy associated with the multicore chip is conserved.

The foregoing summary is illustrative only and is not intended to be in any way limiting. In addition to the illustrative aspects, embodiments, and features described above, further aspects, embodiments, and features will become apparent by reference to the Figures and the following Detailed Description.

BRIEF DESCRIPTION OF THE FIGURES

The foregoing and other features of this disclosure will become more fully apparent from the following Detailed Description, accompanying Figures, and appended claims. Understanding that these Figures depict only several embodiments in accordance with the disclosure and are, therefore, not to be considered limiting of its scope, the disclosure will be described with additional specificity and detail with reference to the accompanying Figures, in which:

DETAILED DESCRIPTION

Figure 1:
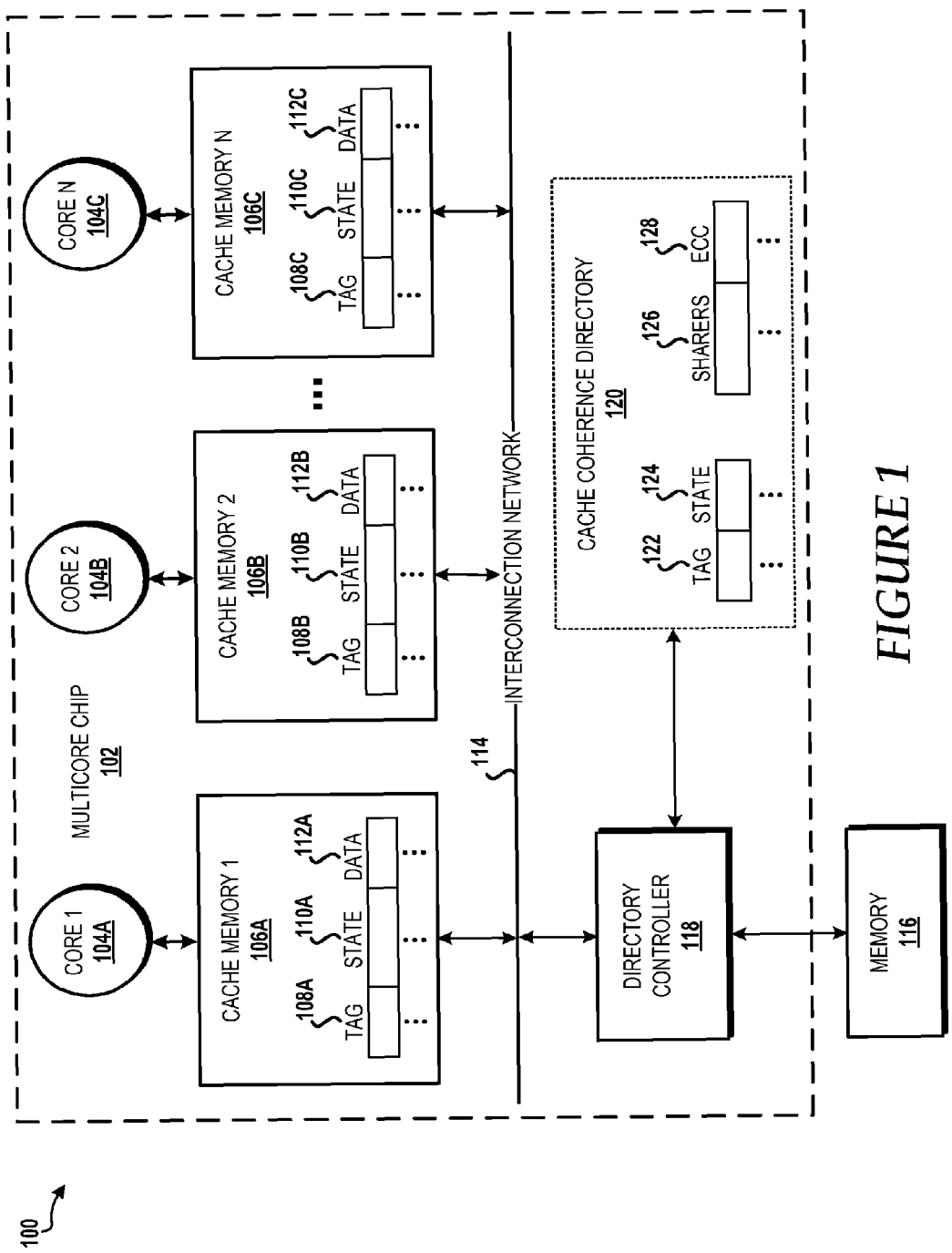
FIG. 1 is a functional block diagram illustrating an example operating environment.

In the present Detailed Description, reference is made to the accompanying Figures, which form a part hereof. In the Figures, similar symbols typically identify similar components, unless context dictates otherwise. The illustrative embodiments described in the Detailed Description and Figures are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Computing devices may utilize multicore chips to execute various instructions provided by operating systems and/or application programs. With continued technology scaling, the number of processor cores that can be integrated on a single multicore chip may continue to follow the trend described by Moore's Law. Multicore technology has entered an era in which threshold voltage can no longer be scaled down without exponentially increasing the static power consumption incurred due to leakage current. This can result in a phenomenon called the "power wall," "utility wall," or "dark silicon," in which an increasing fraction of the chip cannot be powered at full frequency or powered-on at all. A way to improve performance in future multicore chips, therefore, may be to improve energy efficiency.

Storage structures on multicore chips may become increasingly reliant on DRAM instead of SRAM. While DRAM may have higher access latency than SRAM, DRAM may be between eight and sixteen times more dense. The higher density of DRAM may facilitate a constant die area to provide a much larger data storage space compared to SRAM. Some multicore chips, for example, may have level two (L2) caches implemented using DRAM structure instead of SRAM structure. In addition to being dense, DRAM may dissipate less power and, as a result, may be more energy efficient than SRAM.

While conventional directory implementations may utilize SRAM, future directory implementations may utilize DRAM. DRAM cells may store information as charges in capacitors, which can leak energy over time. As a result, DRAM cells may be periodically recharged, or what can be otherwise termed as "refreshed". However, such refresh operations can consume a significant amount of power.

This disclosure is generally drawn, inter alia, to technologies that may be employed to conserve energy in a multicore chip via selective refresh of memory directory entries.

Technologies are described herein for conserving energy in a multicore chip via selectively refreshing memory directory entries. Some described examples may refresh a DRAM that stores a cache coherence directory of a multicore chip. More particularly, a directory entry may be accessed in the cache coherence directory stored in the DRAM. Some further examples may identify a cache coherence state of a memory block associated with the directory entry. In some examples, refresh of the directory entry stored in the DRAM may be selectively disabled based on the identified cache coherence state of the memory block such that energy associated with the multicore chip is conserved. These and other aspects of various technologies configured to conserve energy in a multicore chip via selective refresh of memory directory entries will be described in more detail herein.

FIG. 1 is a functional block diagram illustrating an example operating environment 100, arranged in accordance with at least some embodiments presented herein. The operating environment 100 may include a multicore chip 102. The multicore chip 102 may include a first processor core 104A, a second processor core 104B, and a third processor core 104C. The processor cores 104A-104C may be, at times, referred to collectively or generically as processor cores 104. The multicore chip 102 may also include a first cache memory 106A, a second cache memory 106B, and a third processor core 104C. The cache memories 106A-106C may be, at times, referred to collectively or generically as cache memories 106. Each of the cache memories 106 may be associated with one or more of the processor cores 104.

The first cache memory 106A may be associated with the first processor core 104A; the second cache memory 106B may be associated with the second processor core 104B; and the third cache memory 106C may be associated with the third processor core 104C. In some embodiments, however, one or more of the cache memories 106 may be associated with two or more of the processor cores 104. For instance, the first cache memory 106A may be associated with the first processor core 104A and the second processor core 104B. Other configurations between the processor cores 104 and the cache memories 106 of the multicore chip 102 may also be contemplated.

The first cache memory 106A may include a first tag field 108A, a first state field 110A, and a first data field 112A. The second cache memory 106B may include a second tag field 108B, a second state field 110B, and a second data field 112B. The third cache memory 106C may include a third tag field 108C, a third state field 110C, and a third data field 112C. The tag fields 108A-108C may be, at times, referred to collectively or generically as tag fields 108. The state fields 110A-110C may be, at times, referred to collectively or generically as state fields 110. The data fields 112A-112C may be, at times, referred to collectively or generically as data fields 112. It should be understood that each of the cache memories 106 may include any number of tag fields, state fields, or data fields.

The tag fields 108 may include a tag item used to distinguish to which memory block a particular entry corresponds. The state fields 110 may include a coherence state item that identifies a coherence state of the memory block identified in the corresponding tag field. The data fields 112 may include data stored in the respective cache memory.

The operating environment 100 may also include an interconnection network 114 that may function as a common bus or a point-to-point network through which the processor cores 104 and the cache memories 106 may communicate with a directory controller 118. The directory controller 118 may be adapted to access a cache coherence directory 120 (hereinafter referred to as "directory 120"). The directory 120 may be implemented as a single directory or distributed across multiple directories in the multicore chip 102. In some embodiments, the directory 120 may be provided in a memory component on the multicore chip 102 that is operatively coupled to the directory controller 118. In some embodiments, the directory 120 may be part of the directory controller 118. In some embodiments, the directory controller 118 may be a memory controller. In some other embodiments, the directory controller 118 may be part of a memory controller adapted to control a memory 116 and the directory 120. In any case, the directory 120 may be responsible for tracking coherence states of blocks that are stored within the cache memories 106.

The directory 120 may utilize a cache coherency algorithm to maintain consistency of data stored within one or more of the cache memories 106 and the memory 116. For ease of explanation and not limitation, an illustrative cache coherency algorithm described herein may utilize an exclusive state, a modified state, an invalid state, an uncached state, or a shared state to identify the state of a block. It should be understood, however, that there may be more or less states depending on specific implementations of the directory 120.

The following definitions of the exclusive state, the modified state, the invalid state, the uncached state, and the shared state are merely examples solely for purposes of explanation. It should be understood that an actual implementation of cache states may use the same and/or different definitions as contemplated by one skilled in the art. An exclusive state (E) may indicate that a block is stored in the associated cache memory only. The data in the block may also be consistent with the data stored in the memory 116. A modified state (M) may indicate that a block is valid and the block is stored in the associated cache memory only. The data in the block may be modified with respect to the data stored in the memory 116. In other words, the modified data in the block has not been written back to the memory 116. An invalid state (I) may indicate the block contains an invalid entry—that is, the block is not stored in the associated cache memory or any data contained in the block is considered not useful. An uncached state (U) may indicate that none of the cache memories 106 has a copy of the block. A shared state (S) may indicate that a block may be stored in multiple cache memories 106.

The directory controller 118 may be configured to handle changes between the states in accordance with a cache coherence protocol. Changes between states can occur in response to a request from a cache memory. For example, a first cache memory may request a state change to a block (e.g., from a shared state to an exclusive or modified state) in order for a processor core to write to the block. In response to the request, the directory controller 118 may send invalidation requests to other cache memories that share the block and update the state of the block in the directory 120 from the shared state to an exclusive or modified state.

The directory 120 may include at a directory tag field 122, a directory state field 124, a sharers item field 126, and an error correction code (ECC) field 128. The directory tag field 122 may include a tag item used to identify a block to which a particular directory entry corresponds. The directory state field 124 may include a coherence state item that identifies a coherence state of the block identified in the corresponding tag field. The sharers item field 126 may identify one or more of the cache memories 106 in which a copy of the block is stored.

The sharers item field 126 may include a sharers item. In some embodiments, the sharers item may be a full bit vector in which each of a plurality of bits is associated with a single cache memory of the cache memories 106. For instance, "010" may represent three cache memories with one logic value (e.g., "1") representing that the block identified by a tag item within the directory tag field 122 is kept in the corresponding cache memory, and with another logic value (e.g., "0") representing that the block is not kept in the corresponding cache memory.

In some other embodiments, the sharers item may be a coarse bit vector in which each bit can correspond to a group of two or more of the cache memories 106. For instance, "010" may represent six cache memories with each bit being representative of two of the six cache memories. That is, the first "0" may represent a first pair of cache memories, the "1" may represent a second pair of cache memories, and the second "0" value may represent a third pair of cache memories. In this instance, the first "0" and the second "0" may indicate that neither the first pair of cache memories nor the third pair of cache memories stores the corresponding block. The "1" may indicate that the one or both cache memories in the second pair of cache memories stores the corresponding block. The coarse bit vector may not retain the ability to represent whether a block is stored in each cache memory within a given group (e.g., pair) of cache memories.

In yet some other embodiments, the bit vector may be in a pointer format in which a binary identification is listed for each of the cache memories 106 that stores the block. For example, "00" may identify a first cache memory, "01" may identify a second cache memory, and "10" may identify a third cache memory.

The number of bits included in the sharers item field 126 may increase as the number of cores within the multicore chip 102 increases. The other fields, however, may or may not remain constant in size. In the instances where the other fields remain at least relatively constant in size, more energy may be consumed by the sharers item field 126 than the directory tag field 122 or the directory state field 124. By selectively refreshing directory entries within the directory 120, energy may be conserved. From a traditional point of view, not refreshing an entry may be equal to losing the data recorded in the entry and, as a result, may affect the correctness and reliability of a cache coherence directory. The technologies described herein, however, may be utilized to selectively enable or disable refresh of directory entries without detrimentally affecting the correctness and reliability of the cache coherence directory as with conventional technologies. In particular, as described in greater detail below, the technologies described herein may utilize the unique behavior of DRAM refresh errors and the type of information stored in the directory 120. Implementation of the technologies described herein can cut refresh energy consumption by up to approximately ninety percent by refreshing a fraction of directory entries.

In consideration of various implementations of the technologies disclosed herein, a unique property of errors that may result from not refreshing DRAM cells will now be described. A charged capacitor in a DRAM cell may be interpreted as having a bit value corresponding to a first logic level (e.g., "1"), while a discharged capacitor may be interpreted as having a bit value corresponding to a second logic level (e.g., "0"). In such an interpretation, not refreshing a DRAM cell may cause a bit value of the first logic level (e.g., "1") to be switched to a bit value of the second logic level (e.g., "0") because the DRAM cell will lose its charge. However, because a DRAM cell cannot transition from a discharged state to a charged state without a refresh, not refreshing the DRAM cell may not cause a bit value of the second logic level (e.g., "0") to be switched to a bit value of the first logic level (e.g., "1"). In the directory 120, a bit value of the first logic level (e.g., "1") in the full bit vector format may encode that a block is present in one of the cache memories 106, in accordance with some embodiments. The error due to not refreshing a directory entry may result in the directory 120 not recording that a cache memory stores a block.

In many examples (about fifty percent or more), directory entries may record a single sharers item. This is because many programs that are executable by a multicore chip may not be specifically designed for parallel execution. Instead, many programs may be designed as either sequential programs or multi-threaded programs, which can maintain a block in a single cache memory. Parallel programs may result in more blocks shared across cache memories, but many blocks may still not be shared. Well-optimized parallel programs may partition data across threads to minimize data sharing and communication between threads, so most blocks may be accessed by one thread. Consequently, for most directory entries, the sharers item field 126, in the full bit vector format, may contain a bit that has a value corresponding to the first logic level (e.g., "1").

Thus, in many instances, not refreshing such directory entries may result in at most one bit error because only one bit that has a value of the first logic level (e.g., "1") can flip to the second logic level (e.g., "0"). This can be a unique property that may be true for DRAM directories, such as the directory 120, but may not be true for cache memories, such as the cache memory 106. Directory entries that may result in at most one bit error may include directory entries associated with blocks in an exclusive, modified, or equivalent coherence state. Refresh of directory entries can be avoided if this single bit error can be reliably corrected. To ensure such an error correction capability, each directory entry within the directory 120 may be associated with an Error-Correcting Code (ECC) within the ECC field 128. The ECC may be adapted to correct a single bit error. In some embodiments, the ECC may be a 1-error-correction, 2-error-detection (1EC2ED) code. A 1EC2ED code may also have an ability to detect up to two-bit errors. Although the 1EC2ED code cannot correct the two-bit error, the detection of the two-bit error may trigger the directory 120 to send a broadcast message to all of the cache memories 106 in an effort to restore the precise data that was lost, as will be described in greater detail below with reference to FIG. 6.

The addition of the ECC within the ECC field 128 of the directory 120 may not cost additional hardware in embodiments in which the memory 116 is already adapted to utilize the ECC. In some embodiments, the ECC may be utilized to avoid refreshing directory entries with a particular coherence state.

According to various embodiments, the ECC may be stored in a manner such that it can be reliably retrieved. For example, the ECC may be periodically refreshed if it is stored in a memory (e.g., DRAM) that depends on memory refresh for proper operation. The ECC may be stored in SRAM, a separate DRAM, in an integrated DRAM with other data, or in some other structure capable of storing the ECC such that it can be reliably retrieved as needed.

FIG. 1 illustrates one multicore chip 102, one interconnection network 114, one memory 116, one directory controller 118, and one cache coherence directory 120. It should be understood, however, that some implementations of the operating environment 100 may include two or more multicore chips 102, two or more interconnection networks 114, two or more memories 116, two or more directory controllers 118, and/or two or more cache coherence directories 120. Thus, the various embodiments described herein should be understood as being illustrative of some examples of the operating environment 100 and should not be construed as being limiting in any way.

Figure 2:
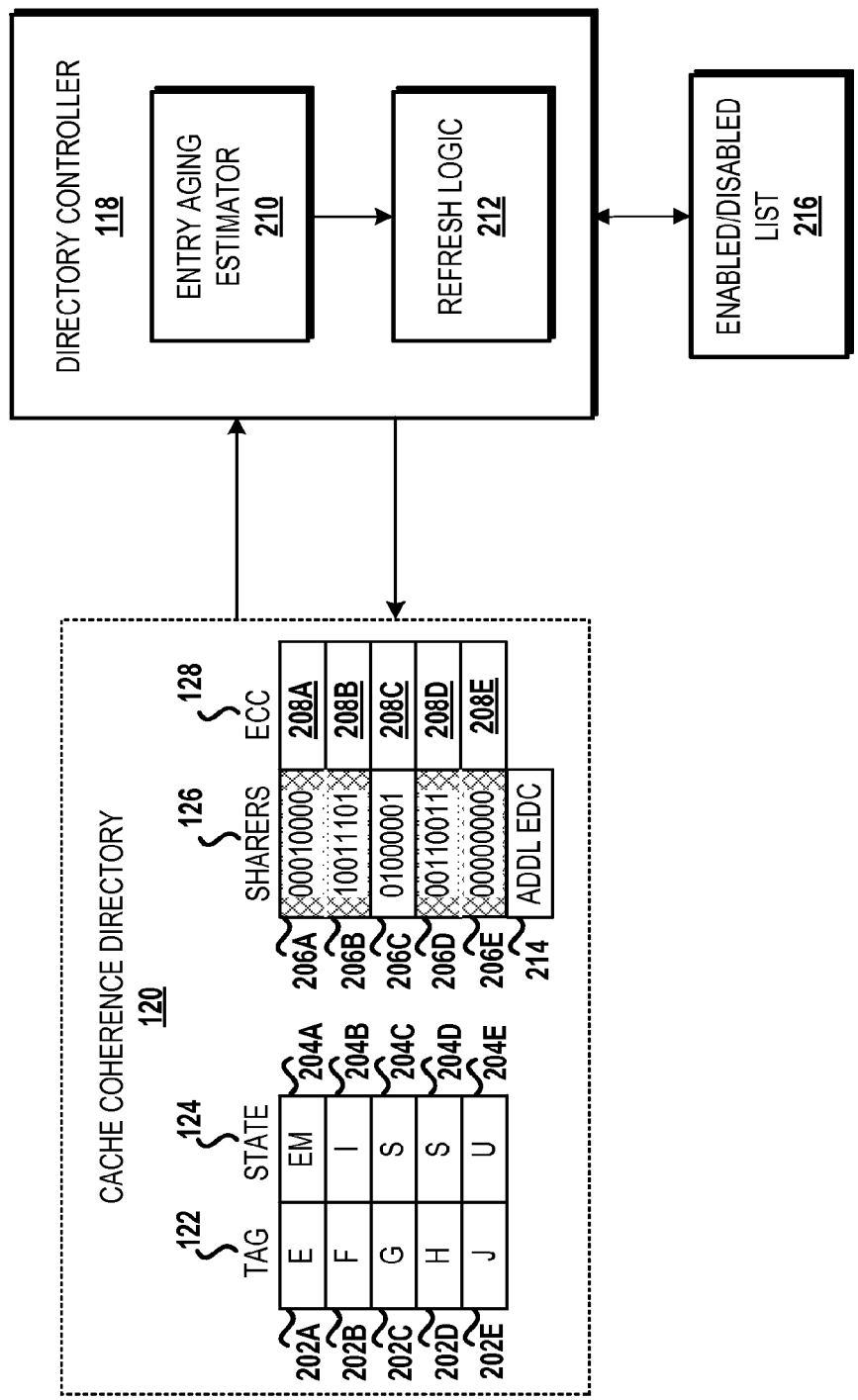
FIG. 2 is a functional block diagram illustrating an example cache coherence directory populated with directory entries, and an example directory controller adapted to control selective refresh of the directory entries.

FIG. 2 is a functional block diagram illustrating an example cache coherence directory populated with directory entries, and an example directory controller adapted to control selective refresh of the directory entries, arranged in accordance with at least some embodiments presented herein. The directory 120 may include the directory tag field 122, the directory state field 124, the sharers item field 126, and the ECC field 128, as described above with reference to FIG. 1. As illustrated in FIG. 2, the directory 120 has been populated with directory entries that correspond to five blocks. Each directory entry may include a tag item, a state item, a sharers item, and an ECC.

A first directory entry may include a first tag item 202A that identifies the first directory entry as corresponding to a block identified by the tag "E," a first state item 204A, a first sharers item 206A, and a first ECC 208A. A second directory entry may include a second tag item 202B that identifies the second directory entry as corresponding to a block identified by the tag "F," a second state item 204B, a second sharers item 206B, and a second ECC 208B. A third directory entry may include a third tag item 202C that identifies the third directory entry as corresponding to a block identified by the tag "G," a third state item 204C, a third sharers item 206C, and a third ECC 208C. A fourth directory entry may include a fourth tag item 202D that identifies the fourth directory entry as corresponding to a block identified by the tag "H," a fourth state item 204D, a fourth sharers item 206D, and a fourth ECC 208D. A fifth directory entry may include a fifth tag item 202E that identifies the fifth directory entry as corresponding to a block identified by the tag "J," a fifth state item 204E, a fifth sharers item 206E, and a fifth ECC 208E.

The directory controller 118 may include an entry aging estimator 210 and refresh logic 212. In some embodiments, the directory controller 118 may be configured to provide functions and operations corresponding to the entry aging estimator 210 and/or the refresh logic 212. In some other embodiments, the entry aging estimator 210 and/or the refresh logic 212 may be distinct from the directory controller 118. The entry aging estimator 210 will be described in greater detail below. The refresh logic 212 may be configured to selectively disable or enable refresh of one or more of the directory entries contained within the directory 120 based upon the coherence state of the blocks associated with the directory entries.

As explained above, not refreshing a directory entry may cause a single bit error in the directory entry for all blocks in exclusive, modified, or equivalent coherence state. The 1EC2ED code may be sufficiently strong to correct such an error when it occurs. If there is another simultaneous error, resulting in a two-bit error, the error may be detectable because the 1EC2ED code can be utilized to detect two-bit errors. An additional error detection code (EDC) 214 may be provided if better detection is needed. An ECC may not be capable of correcting a two-bit or larger error. For cases in which an error is detected in two or more bits, the directory controller 118 may be configured to recover the lost data by sending a broadcast message to query all of the cache memories 106 in regards to whether each cache memory stores the block identified by the corresponding tag. A process that illustrates this functionality is described in greater detail herein below with reference to FIG. 6.

The refresh logic 212 may be configured to selectively disable a refresh for a directory entry when the directory entry is associated with a block in an exclusive or modified cache coherence state. FIG. 2 illustrates block "E" as being in an exclusive or modified coherence state, which is identified in the directory state field 124 by the first state item 204A with a value of "EM". Also as illustrated in FIG. 2, the sharers field 206A shows, in a full bit vector format, that one bit has a value of "1" and the remainder of the bits has a value of "0". Hence, not refreshing the sharers field 206A may introduce only up to 1 bit error in this example. The refresh logic 212 may be configured to determine that the first directory entry is not to be refreshed because block "E" is stored in only one of the cache memories 106. The refresh logic 212 may be configured to selectively disable refresh of the first directory entry based on the determination that block "E" is stored in only one of the cache memories 106. Cross-hatching is shown in the corresponding first sharers item 206A in FIG. 2 to represent that no refresh is applied to the first directory entry. It should be understood that not refreshing a directory entry may not guarantee the entry will suffer from an error because some DRAM cells can hold charges up to several seconds. In addition, when a directory entry is read, the charge for the corresponding DRAM cell may be restored.

The refresh logic 212 may be configured to selectively disable a refresh for a directory entry when the directory entry is associated with a block in an invalid coherence state. FIG. 2 illustrates block "F" as being in an invalid coherence state, which is identified in the directory state field 124 by the second state item 204B with a value of "I". The refresh logic 212 may be configured to determine that the second directory entry is not to be refreshed because block "F" does not contain any useful data. As a result, there may be no negative consequence from disabling refresh for this directory entry. Therefore, the refresh logic 212 may be configured to selectively disable refresh of the second directory entry based on the determination that block "F" is in an invalid coherence state. Cross-hatching is shown in the second sharers item 206B in FIG. 2 to represent that no refresh is applied to the second directory entry.

In certain implementations, the directory 120 may be overprovisioned to contain more directory entries than the number of blocks that can be cached in one or more of the cache memories 106. In these implementations, the extra directory entries may correspond to blocks in an invalid coherence state. Thus, disabling refresh for directory entries associated with blocks that are in an invalid coherence state can be utilized to reduce energy consumption. For instance, if a computing system has two directory controllers and two cache coherence directories operatively coupled to the directory controllers, cached blocks may come from either directory. In such an instance where cached blocks may come from either directory, performance can be affected if each directory can track only half of all the blocks. Hence, each directory may be overprovisioned with additional entries. In such a computing system, selectively disabling refresh of the directory entries that are associated with blocks within an invalid cache coherence state can effectively avoid refreshing about fifty percent of the directory entries of the system and may reduce the system's overall energy consumption.

The refresh logic 212 may be configured to selectively disable a refresh for a directory entry when the directory entry is associated with a block in a shared state and the data contained within the block is determined to be stale. Data may be determined to be stale when a shared state indicates that the corresponding block is clean. A clean block may indicate that the data stored in the block is the same as the data stored in the memory 116. A dirty block, on the other hand, may indicate that the data stored in the block is not the same as the data stored in the memory 116. A cache memory can be configured such that that a clean block stored in the cache memory can be evicted without notifying the directory 120. As a result, over time, a directory entry may still indicate that the block is cached within a particular cache memory when, in fact, the block has been evicted and is no longer cached within that cache memory.

The directory controller 118 may be configured to incorporate the entry aging estimator 210 to determine when a directory entry has aged to the point that the data can be identified as stale. The entry aging estimator 210 may be adapted to identify a last access time to indicate when a given block in the cache memory was last accessed. The entry aging estimator 210 may be configured to determine, based at least in part on the last access time, whether a block has aged. For example, the entry aging estimator 210 may determine that a block has aged when a threshold time after the last access time has been reached. If the entry aging estimator 210 determines that a block has aged, the entry aging estimator 210 may be further configured to instruct the refresh logic 212 to skip a refresh of the directory entry associated with the block. If, however, the entry aging estimator 210 determines that the block has not aged, the entry aging estimator 210 may be configured to instruct the refresh logic 212 to proceed with a refresh of the directory entry associated with the block.

As illustrated in FIG. 2, the block "G" and the block "H" are both in a shared state as identified by the third state item 204C and the fourth state item 204D, respectively, having a value of "S". No cross-hatching is shown in the third sharers item 206C to represent that a refresh may be applied to be the third directory entry. For example, the entry aging estimator 210 may determine that the block "G" has not aged. Cross-hatching is shown in the fourth sharers item 206D to represent that no refresh is applied to the fourth directory entry. For example, the entry aging estimator 210 may determine that the block "H" has aged.

The refresh logic 212 may be configured to selectively disable a refresh for a directory entry when the directory entry is identified with a block in an uncached cache coherence state. FIG. 2 illustrates block "J" as being in an uncached coherence state, which is identified in the directory state field 124 by the fifth state item 204E with a value of "U". The refresh logic 212 may be configured to disable the refresh for the fifth directory entry when block "J" is determined as not shared in any of the cache memories 106. As a result, there may be substantially no negative consequence from disabling refresh for this directory entry. The refresh logic 212 may be configured to selectively disable refresh of the fifth directory entry based on the determination that block "J" is in an uncached coherence state. The fifth sharers item 206E is grayed-out in FIG. 2 to represent that no refresh is applied to the fifth directory entry.

According to various embodiments, the directory controller 118 may be coupled to an enabled/disabled list 216. The enabled/disabled list 216 may be configured to track for which directory entries refresh is enabled and for which directory entries refresh is disabled. The refresh logic 212 may utilize the enabled/disabled list 216 in order to determine which directory entries to refresh. The directory controller 118 may be configured to update the enabled/disabled list 216 as refresh is enabled and/or disabled for various directory entries, for example, if a state of one the directory entries changes.

Figure 3:
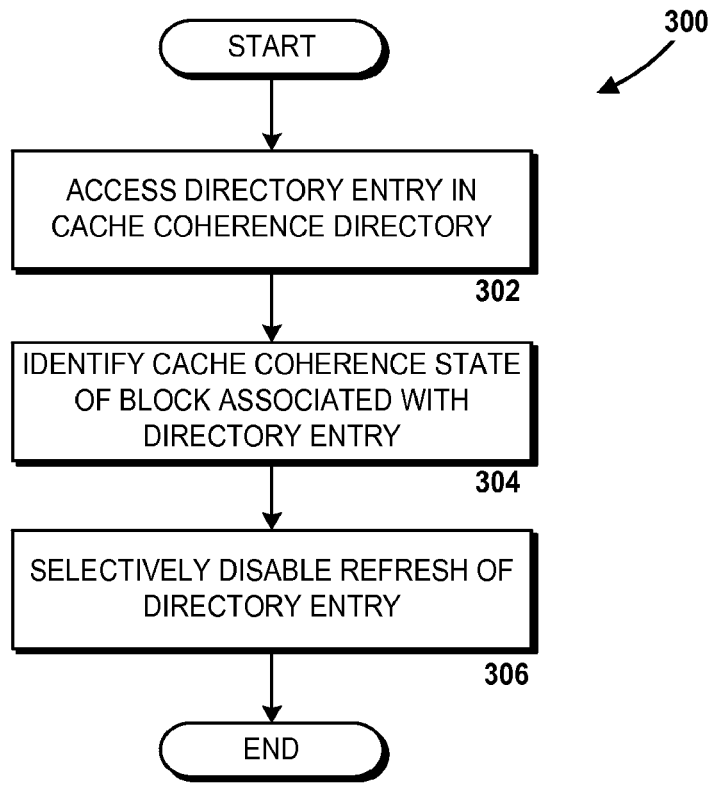
FIG. 3 is a flow diagram illustrating a first example process adapted to refresh a DRAM configured to store a cache coherence directory of a multicore chip.

FIG. 3 is a flow diagram illustrating a first example process 300 adapted to refresh a DRAM configured to store a cache coherence directory of a multicore chip, arranged in accordance with at least some embodiments presented herein. The process 300 may include various operations, functions, or actions as illustrated by one or more blocks 302-306.

The process 300 may begin at block 302 (Access Directory Entry in Cache Coherence Directory), wherein the directory controller 118 may be configured to access a directory entry in a cache coherence directory, such as the directory 120. Block 302 may be followed by block 304.

At block 304 (Identify Cache Coherence State of Block Associated with Directory Entry), the directory controller 118 may be configured to identify a cache coherence state of a block associated with the directory entry. Block 304 may be followed by block 306.

At block 306 (Selectively Disable Refresh of Directory Entry), the directory controller 118 may be configured to selectively disable a refresh of the directory entry based on the identified cache coherence state of the block such that energy associated with the multicore chip 102 can be conserved. In some embodiments, the directory controller 118, at block 306, may be configured to selectively disable the refresh of the directory entry when the cache coherence state identified at block 304 is an exclusive state, a modified state, an invalid state, or an uncached state.

After block 306, the process 300 may end or revert to block 302, wherein the directory controller 118 may be configured to access another directory entry in the directory 120. The process 300 may repeat (e.g., periodically, continuously, or on-demand) or terminate.

Figure 4:
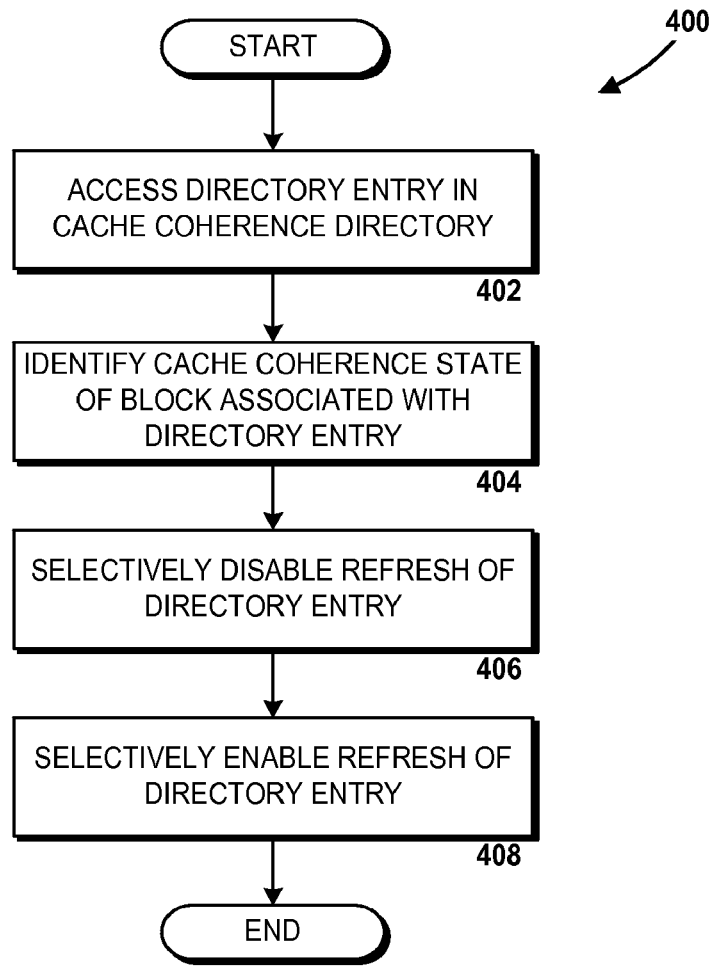
FIG. 4 is a flow diagram illustrating a second example process adapted to refresh a DRAM configured to store a cache coherence directory of a multicore chip.

FIG. 4 is a flow diagram illustrating a second example process 400 adapted to refresh a DRAM configured to store a cache coherence directory of a multicore chip, arranged in accordance with at least some embodiments presented herein. The process 400 may include various operations, functions, or actions as illustrated by one or more blocks 402-408.

The process 400 may begin at block 402 (Access Directory Entry in Cache Coherence Directory), wherein the directory controller 118 may be configured to access a directory entry in a cache coherence directory, such as the directory 120. Block 402 may be followed by block 404.

At block 404 (Identify Cache Coherence State of Block Associated with Directory Entry), the directory controller 118 may be configured to identify a cache coherence state of a block associated with the directory entry. Block 404 may be followed by block 406.

At block 406 (Selectively Disable Refresh of Directory Entry), the directory controller 118 may be configured to selectively disable refresh of the directory entry based on the identified cache coherence state of the block such that energy associated with the multicore chip 102 can be conserved. Block 406 may be followed by block 408.

At block 408 (Selectively Enable Refresh of Directory Entry), the directory controller 118 may be configured to selectively enable refresh of the directory entry based on the identified cache coherence state of the block. In some embodiments, the directory controller 118, at block 406, may be configured to selectively disable refresh of the directory entry when the cache coherence state is identified as an exclusive state, a modified state, an invalid state, or an uncached state. In some embodiments, the directory controller 118, at block 408, may be configured to selectively enable the refresh of the directory entry when the cache coherence state is identified as a shared state. In this manner, the directory controller 118 may selectively disable refresh of directory entries within the directory 120 and then selectively enable refresh of directory entries within the directory 120 based on certain coherence states of the blocks associated therewith.

After block 408, the process 400 may end or revert to block 402, wherein the directory controller 118 may be configured to access another directory entry in the directory 120. The process 400 may repeat (e.g., periodically, continuously, or on-demand) or terminate.

Figure 5:
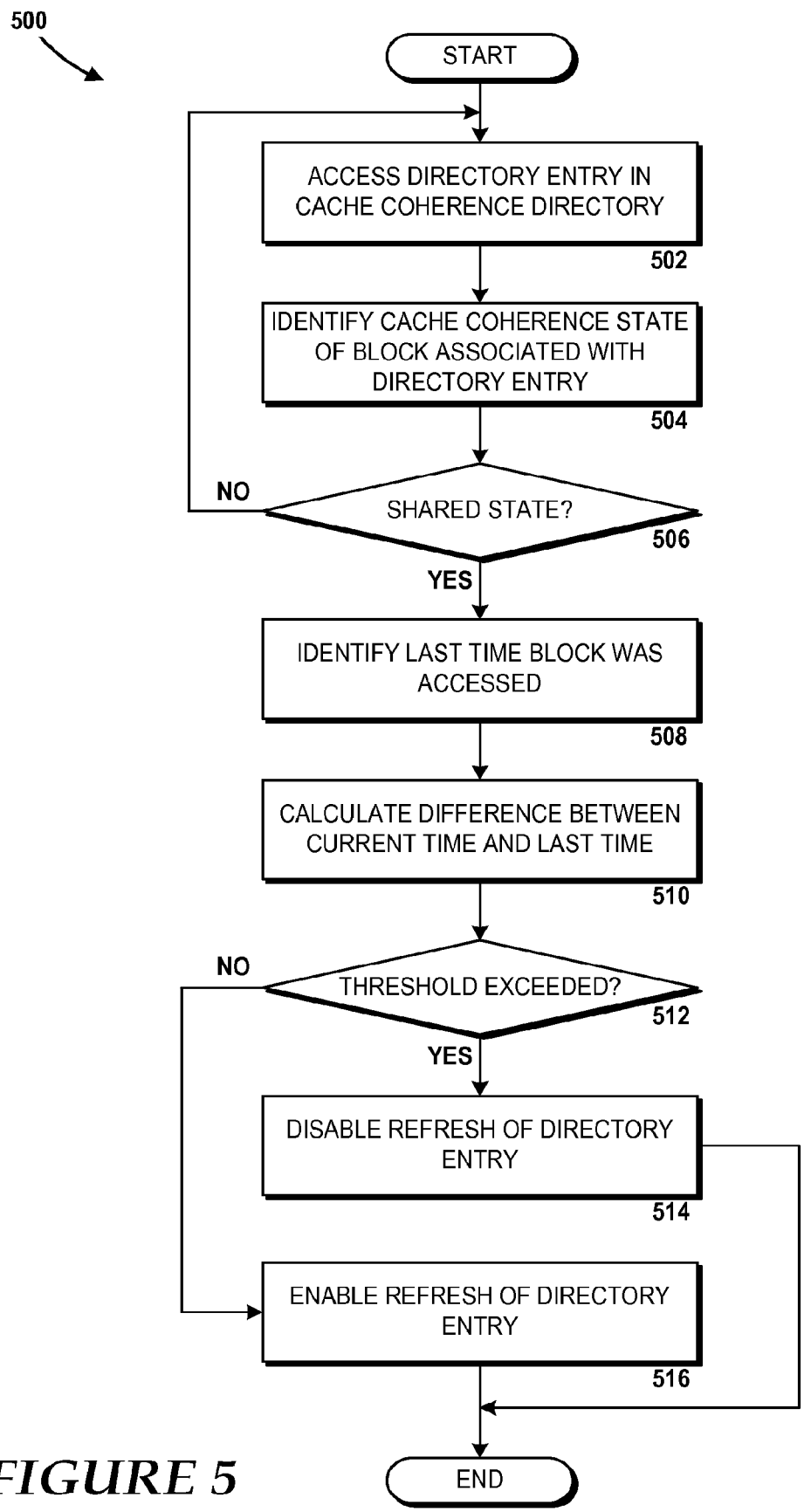
FIG. 5 is a flow diagram illustrating a third example process adapted to refresh a DRAM configured to store a cache coherence directory of a multicore chip.

FIG. 5 is a flow diagram illustrating a third example process 500 adapted to refresh a DRAM configured to store a cache coherence directory of a multicore chip, arranged in accordance with at least some embodiments presented herein. The process 500 may include various operations, functions, or actions as illustrated by one or more blocks 502-516.

The process 500 may begin at block 502 (Access Directory Entry in Cache Coherence Directory), wherein the directory controller 118 may be configured to access a directory entry in a cache coherence directory, such as the directory 120. Block 502 may be followed by block 504.

At block 504 (Identify Cache Coherence State of Block Associated with Directory Entry), the directory controller 118 may be configured to identify a cache coherence state of a block associated with the directory entry. Block 504 may be followed by block 506.

At block 506 (Shared State?), the directory controller 118 may be configured to determine if the cache coherence state identified at block 504 is a shared state. If the directory controller 118 determines that the cache coherence state is not a shared state, then the process 500 may revert to block 502 to access another directory entry or end. If the directory controller 118 determines that the cache coherence state is a shared state, then block 506 may be followed by block 508.

At block 508 (Identify Last Time Block was Accessed), the directory controller 118 may be configured to identify a last time at which the block was accessed. Block 508 may be followed by block 510.

At block 510 (Calculate Difference between Current Time and Last Time), the directory controller 118 may be configured to calculate a difference between a current time and the last time. Block 510 may be followed by block 512.

At block 512 (Threshold Exceeded?), the directory controller 118 may be configured to determine if the difference calculated at block 510 exceeds a threshold difference. If the directory controller 118 determines that the difference exceeds the threshold difference, then block 512 may be followed by block 514. If the directory controller 118 determines that the difference does not exceed the threshold different, then block 512 may be followed by block 516.

At block 514 (Disable Refresh of Directory Entry), the directory controller 118 may be configured to disable refresh of the directory entry. After block 514, the process 500 may end or revert to block 502, wherein the directory controller 118 may be configured to access another directory entry in the directory 120. After block 514, the process 500 may repeat (e.g., periodically, continuously, or on-demand) or terminate.

At block 516 (Enable Refresh of Directory Entry), the directory controller 118 may be configured to enable refresh of the directory entry. After block 516, the process 500 may end or revert to block 502, wherein the directory controller 118 may be configured to access another directory entry in the directory 120. After block 516, process 500 may repeat (e.g., periodically, continuously, or on-demand) or terminate.

Blocks 508, 510, 512 may be performed by the entry aging estimator 210 described above with reference to FIG. 2. The entry aging estimator 210 may be configured to provide enable or disable instructions to the refresh logic 212. The refresh logic 212 may be configured to disable, at block 514, or enable, at block 516, refresh of the directory entry based on the enable or disable instructions, respectively.

Figure 6:
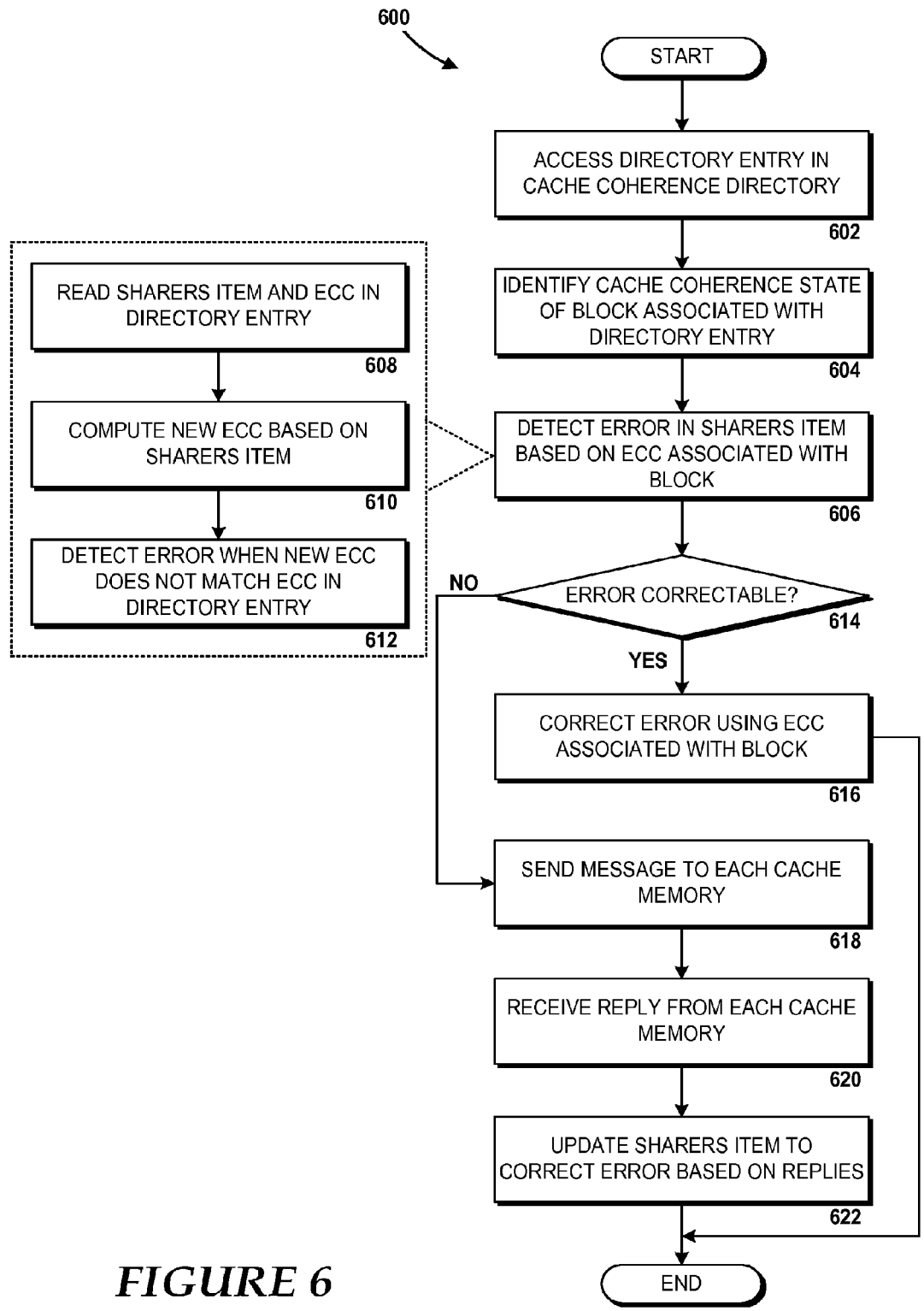
FIG. 6 is a flow diagram illustrating a fourth example method adapted to refresh a DRAM configured to store a cache coherence directory of a multicore chip.

FIG. 6 is a flow diagram illustrating a fourth example method 600 adapted to refresh a DRAM configured to store a cache coherence directory of a multicore chip, arranged in accordance with at least some embodiments presented herein. The process 600 may include various operations, functions, or actions as illustrated by one or more blocks 602-622.

The process 600 may begin at block 602 (Access Directory Entry in Cache Coherence Directory), wherein the directory controller 118 may be configured to access a directory entry in a cache coherence directory, such as the directory 120. Block 602 may be followed by block 604.

At block 604 (Identify Cache Coherence State of Block Associated with Directory Entry), the directory controller 118 may be configured to identify a cache coherence state of a block associated with the directory entry. Block 604 may be followed by block 606.

At block 606 (Detect Error in Sharers Item Based on ECC Associated with Block), the directory controller 118 may be configured to detect an error in a sharers item within a sharers item field, such as the sharers item field 126 of the directory 120, based on an ECC stored in an ECC field, such as the ECC field 128, associated with the block. Block 606 may be followed by block 614. Also, block 606 may optionally include one or more sub-blocks 608-612.

At sub-block 608 (Read Sharers Item and ECC in Directory Entry), the directory controller 118 may be configured to read a sharers item and an ECC in the directory entry. Sub-block 608 may be followed by sub-block 610.

At sub-block 610 (Compute New ECC Based on Sharers Item), the directory controller 118 may be configured to compute a new ECC based on the sharers item. Sub-block 610 may be followed by sub-block 612.

At sub-block 612 (Detect Error When New ECC Does Not Match ECC in Directory Entry), the directory controller 118 may be configured to detect an error when the new ECC does not match the ECC read in the directory entry. Block 606 may be followed by block 614.

At block 614 (Error Correctable?), the directory controller 118 may be configured to determine if the error is correctable using the ECC. If the directory controller 118 determines that the error is correctable using the ECC, then block 614 may be followed by block 616. If the directory controller 118 determines that the error is not correctable using the ECC, then block 614 may be followed by block 618.

At block 616 (Correct Error Using ECC Associated with Block), the directory controller 118 may be configured to correct the error using the ECC associated with the block. After block 616, the process 600 may end or revert to block 602, wherein the directory controller 118 may be configured to access another directory entry in the directory 120. The process 600 may repeat (e.g., periodically, continuously, or on-demand) or terminate.

At block 618 (Send Message to Each Cache Memory), the directory controller 118 may be configured to generate a message and send the message to each of the cache memories 106. The message may include a request to determine if a cache memory contains the block corresponding to the directory entry accessed in block 602. Block 618 may be followed by block 620.

At block 620 (Receive Reply from Each Cache Memory), the directory controller 118 may be configured to receive a reply to the message from one or more of the cache memories 106. The reply may indicate whether a given cache memory contains the block. In some embodiments, the reply may contain the requested block. In some other embodiments, the reply may not contain the requested block. Block 620 may be followed by block 622.

At block 622 (Update Sharers Item to Correct Error Based on Replies), the directory controller 118 may be configured to update the sharers item within the sharers item field 126 of the directory entry to correct the error based upon the replies. After block 622, the process 600 may end or may revert to block 602, wherein the directory controller 118 may be configured to access another directory entry in the directory 120. The process 600 may repeat (e.g., periodically, continuously, or on-demand) or terminate.

Figure 7:
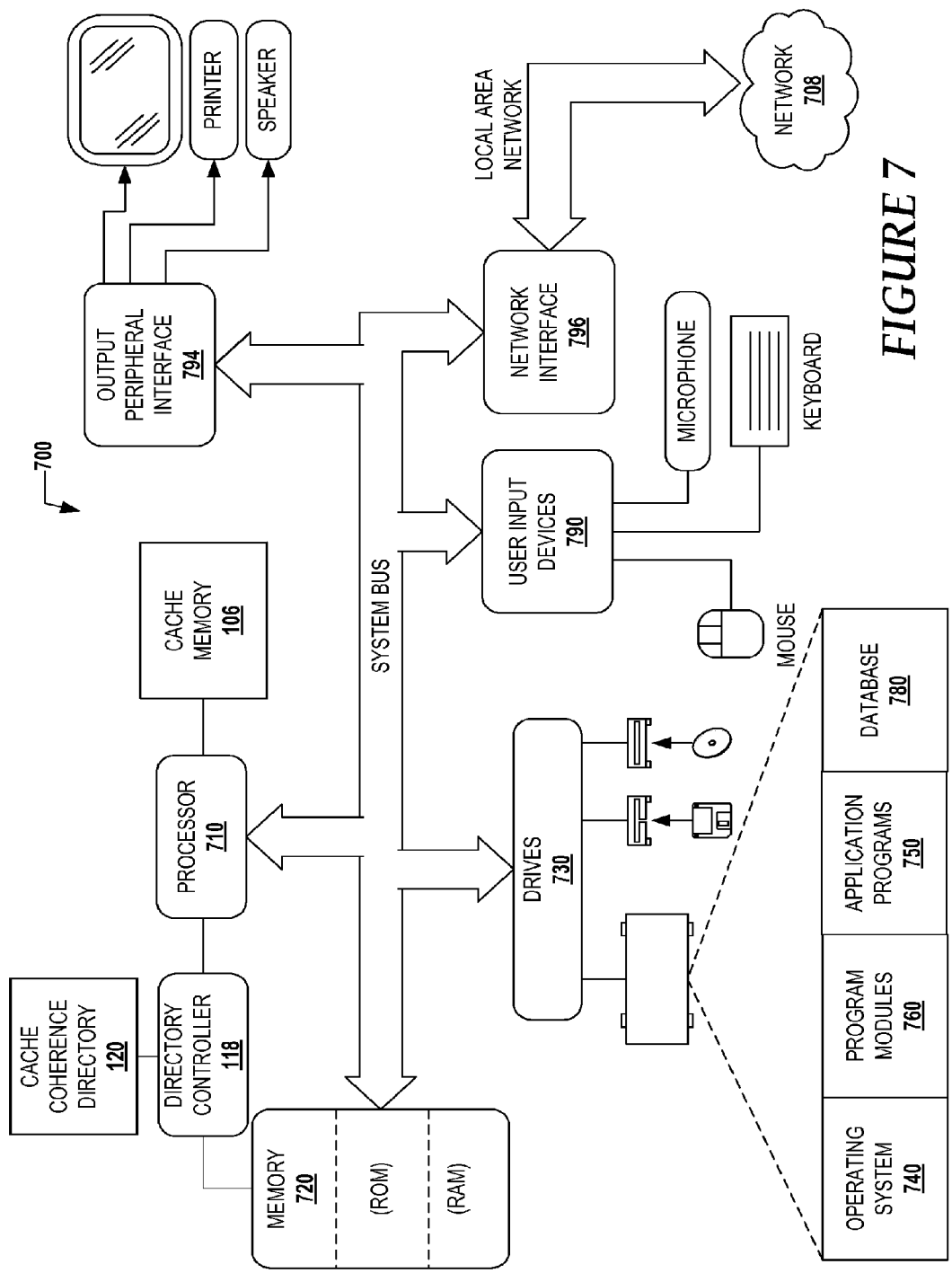
FIG. 7 is a block diagram illustrating a computer hardware architecture for an example computing device.

FIG. 7 is a block diagram illustrating a computer hardware architecture for an example computing device arranged according to at least some embodiments presented herein. As depicted, a computer 700 includes a processor 710, a memory 720, and one or more drives 730. The computer 700 may be implemented as a conventional computer system, an embedded control computer, a laptop computer, a server computer, a mobile device, a set-top box, a kiosk, a vehicular information system, a mobile telephone, a customized machine, or other hardware platform.

The processor 710 may be configured like the multicore chip 102 described herein above with reference to FIG. 1. In particular, the processor 710 may include one or more processor cores, each of which may be operatively coupled to one or more cache memories, such as the cache memory 106. As illustrated in FIG. 7, the cache memory 106, the directory controller 118, or the directory 120 may be operatively coupled to the processor 710. Alternatively, one or more of these components may be on-chip on the processor 710. The directory controller 118 may also be configured to communicate with the memory 720, which may be configured like the memory 116 described herein above. The directory 120 may be implemented as a single directory or distributed across multiple directories within the processor 710.

The drives 730 and their associated computer storage media, provide storage of computer-readable instructions, data structures, program modules and other data for the computer 700. The drives 730 can include an operating system 740, application programs 750, program modules 760, and a database 780. The computer 700 further includes user input devices 790 through which a user may enter commands and data. The user input devices 790 can include one or more of an electronic digitizer, a microphone, a keyboard and pointing device, commonly referred to as a mouse, trackball or touch pad. Other input devices may include a joystick, game pad, satellite dish, scanner, other devices, or the like.

These and other input devices can be coupled to the processor 710 through a user input interface that is coupled to a system bus, but may be coupled by other interface and bus structures, such as a parallel port, game port or a universal serial bus ("USB"). Computers such as the computer 700 may also include other peripheral output devices such as speakers, printers, displays, and/or other devices, which may be coupled through an output peripheral interface 794 or the like.

The computer 700 may operate in a networked environment using logical connections to one or more computers, such as a remote computer (not illustrated) and/or other devices operating as part of or in communication with a network 708 coupled to a network interface 796. The remote computer may be a personal computer, a server computer, a router, a network PC, a peer device or other common network node, and can include many or all of the elements described above relative to the computer 700. Networking environments are commonplace in offices, enterprise-wide area networks ("WAN"), local area networks ("LAN"), intranets, and the Internet.

When used in a LAN or WLAN networking environment, the computer 700 may be coupled to the LAN through the network interface 796 or an adapter. When used in a WAN networking environment, the computer 700 typically includes a modem or other means for establishing communications over the WAN, such as the Internet or the network 708. The WAN may include the Internet, the illustrated network 708, various other networks, or any combination thereof. It will be appreciated that other mechanisms of establishing a communications link, ring, mesh, bus, cloud, or network between the computers may be used.

According to some embodiments, the computer 700 may be coupled to a networking environment. The computer 700 may include one or more instances of a physical computer-readable storage medium or media associated with the drives 730 or other storage devices. The system bus may enable the processor 710 to read code and/or data to/from the computer storage media. The media may represent an apparatus in the form of storage elements that are implemented using any suitable technology including, but not limited to, semiconductors, magnetic materials, optical media, electrical storage, electrochemical storage, or any other such storage technology. The media may represent components associated with memory 720, whether characterized as RAM, ROM, flash, or other types of volatile or nonvolatile memory technology. The media may also represent secondary storage, whether implemented as the storage drives 730 or otherwise. Hard drive implementations may be characterized as solid state, or may include rotating media storing magnetically-encoded information.

The storage media may include one or more program modules 760. The program modules 760 may include software instructions that, when loaded into the processor 710 and executed, transform a general-purpose computing system into a special-purpose computing system. As detailed throughout this description, the program modules 760 may provide various tools or techniques by which the computer 700 may participate within the overall systems or operating environments using the components, logic flows, and/or data structures discussed herein.

The processor 710 may be constructed from any number of transistors or other circuit elements, which may individually or collectively assume any number of states. More specifically, the processor 710 may operate as a state machine or finite-state machine Such a machine may be transformed to a second machine, or specific machine by loading executable instructions contained within the program modules 760. These computer-executable instructions may transform the processor 710 by specifying how the processor 710 transitions between states, thereby transforming the transistors or other circuit elements constituting the processor 710 from a first machine to a second machine The states of either machine may also be transformed by receiving input from the one or more user input devices 790, the network interface 796, other peripherals, other interfaces, or one or more users or other actors. Either machine may also transform states, or various physical characteristics of various output devices such as printers, speakers, video displays, or otherwise.

Encoding the program modules 760 may also transform the physical structure of the storage media. The specific transformation of physical structure may depend on various factors, in different implementations of this description. Examples of such factors may include, but are not limited to: the technology used to implement the storage media, whether the storage media are characterized as primary or secondary storage, or the like. For example, if the storage media are implemented as semiconductor-based memory, the program modules 760 may transform the physical state of the semiconductor memory 720 when the software is encoded therein. For example, the software may transform the state of transistors, capacitors, or other discrete circuit elements constituting the semiconductor memory 720.

As another example, the storage media may be implemented using magnetic or optical technology such as drives 730. In such implementations, the program modules 760 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. It should be appreciated that various other transformations of physical media are possible without departing from the scope and spirit of the present description. As used in the claims, the phrase "computer storage medium," and variations thereof, does not include waves, signals, and/or other transitory and/or intangible communication media, per se.

Figure 8:
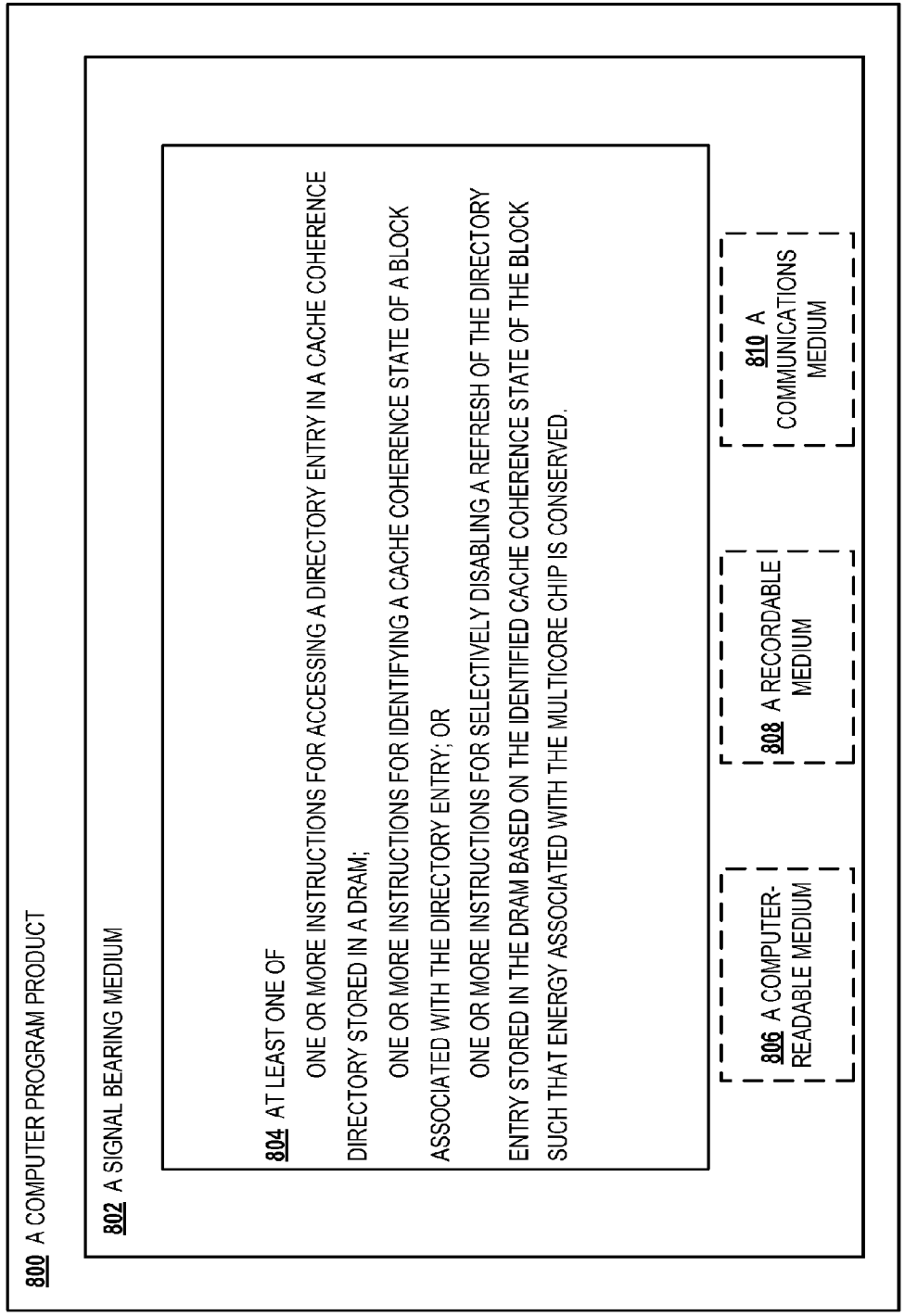
FIG. 8 is a schematic diagram illustrating a computer program product that includes a computer program for executing a computer process on a computing device, all arranged according to at least some embodiments presented herein.

FIG. 8 is a schematic diagram illustrating computer program products 800 that include a computer program for executing a computer process on a computing device, according to at least some embodiments presented herein. An illustrative embodiment of the example computer program product 800 is provided using a signal bearing medium 802, and may include at least one instruction 804. The at least one instruction 804 may include: one or more instructions for accessing a directory entry in a cache coherence directory stored in a DRAM; one or more instructions for identifying a cache coherence state of a block associated with the directory entry; or one or more instructions for selectively disabling a refresh of the directory entry stored in the DRAM based on the identified cache coherence state of the block such that energy associated with the multicore chip is conserved. In some embodiments, the signal bearing medium 802 of the one or more computer program products 800 includes a computer-readable medium 806, a recordable medium 808, and/or a communications medium 810.

While the subject matter described herein is presented in the general context of program modules that execute in conjunction with the execution of an operating system and application programs on a computer system, those skilled in the art will recognize that other implementations may be performed in combination with other types of program modules. Generally, program modules include routines, programs, components, data structures, and other types of structures that perform particular tasks or implement particular abstract data types. Moreover, those skilled in the art will appreciate that the subject matter described herein may be practiced with other computer system configurations, including hand-held devices, multi-core processor systems, microprocessor-based or programmable consumer electronics, minicomputers, mainframe computers, or the like.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, compounds, or compositions, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method to refresh a dynamic random access memory (DRAM) that stores a cache coherence directory of a multi-core chip, the method comprising:
    accessing a directory entry in the cache coherence directory stored in the DRAM, the directory entry comprising a sharers item that identifies which of a plurality of cache memories in the multicore chip store a block associated with the directory entry, and an error correction code (ECC) for either or both detection and correction of an error in the sharers item;
    detecting the error in the sharers item based on the ECC;
    in response to a determination that the detected error is not correctable by use of the ECC:
        broadcasting a message to each cache memory of the plurality of cache memories in the multicore chip, wherein the message requests each cache memory to determine if the corresponding cache memory contains the block;
        receiving replies to the message; and
        updating the sharers item to correct the detected error based on the received replies;
    identifying the cache coherence state of the block associated with the directory entry; and
    selectively disabling a refresh of the directory entry in the cache coherence directory stored in the DRAM based on the identified cache coherence state of the block such that energy associated with the multicore chip is conserved.

2. The method of claim 1, wherein selectively disabling further comprises disabling the refresh of the directory entry when the cache coherence state is identified as one of an exclusive state, a modified state, an invalid state, or an uncached state.

3. The method of claim 1, further comprising selectively enabling the refresh of the directory entry when the cache coherence state is identified as one of an exclusive state, a modified state, an invalid state, or an uncached state.

4. The method of claim 1, further comprising selectively enabling the refresh of the directory entry when the cache coherence state is identified as a shared state.

5. The method of claim 1, further comprising:
    when the cache coherence state of the block is identified as a shared state:
        identifying a last time when the block was accessed;
        calculating a difference between a current time and the last time; determining if the difference exceeds a threshold;
        disabling refresh of the directory entry when the difference exceeds the threshold; and
        enabling refresh of the directory entry when the difference does not exceed the threshold.

6. The method of claim 1, wherein the directory entry further comprises a tag identifying the block and the cache coherence state of the block.

7. The method of claim 6, further comprising:
    determining whether the detected error is correctable using the ECC; and
    correcting the detected error using the ECC when the detected error is correctable.

8. The method of claim 1, wherein detecting the error in the sharers item based on the ECC comprises:
    reading the sharers item and the ECC in the directory entry;
    computing a new ECC based on the sharers item; and
    detecting the error in the sharers item when the new ECC does not match the ECC in the directory entry.

9. The method of claim 7, wherein accessing the directory entry comprising the sharers item identifying which of the plurality of cache memories in the multicore chip store the block comprises:
    accessing the sharers item comprising a bit vector, the bit vector comprising a plurality of bits, wherein each of the plurality of bits in the bit vector is associated with one or more cache memories of the plurality of cache memories in the multicore chip.

10. The method of claim 8, wherein detecting the error in the sharers item when the new ECC does not match the ECC in the directory entry comprises:
   detecting up to a two-bit error in the bit vector and correcting a one-bit error in the bit vector using the ECC, the ECC comprising a 1-error-correction, 2-error-detection (1EC2ED) code.

11. The method of claim 10, further comprising:
   detecting a greater than two-bit error in the bit vector using an additional error direction code contained in the directory entry.

12. A non-transitory computer-readable storage medium having computer-executable instructions stored thereon which, in response to execution by a computing device, cause the computing device to:
   access a directory entry in a cache coherence directory of a multicore chip stored in a dynamic random access memory (DRAM), the directory entry comprising a sharers item that identifies which of a plurality of cache memories in the multicore chip store a block associated with the directory entry, and an error correction code (ECC) for either or both detection and correction of an error in the sharers item;
   detect the error in the sharers item based on the ECC;
   in response to a determination that the detected error is not correctable by use of the ECC:
      broadcast a message to each cache memory of the plurality of cache memories in the multicore chip, wherein the message requests each cache memory to determine if the corresponding cache memory contains the block;
      receive replies to the message; and
      update the sharers item to correct the detected error based on the received replies;
   identify the cache coherence state of the block associated with the directory entry; and
   selectively disable a refresh of the directory entry in the cache coherence directory stored in the DRAM based on the identified cache coherence state of the block such that energy associated with the multicore chip is conserved.

13. The non-transitory computer-readable storage medium of claim 12, wherein the computer-executable instructions, in response to execution by the computing device, further cause the computing device to:
   selectively disable the refresh of the directory entry stored in the DRAM when the cache coherence state of the block is identified as one of an exclusive state, a modified state, an invalid state, or an uncached state.

14. The non-transitory computer-readable storage medium of claim 12, wherein the computer-executable instructions, in response to execution by the computing device, further cause the computing device to:
   selectively enable the refresh of the directory entry stored in the DRAM when the cache coherence state of the block is identified as one of an exclusive state, a modified state, an invalid state, or an uncached state.

15. The non-transitory computer-readable storage medium of claim 12, wherein the computer-executable instructions, in response to execution by the computing device, further because the computing device to:
   selectively enable the refresh of the directory entry stored in the DRAM when the cache coherence state is identified as a shared state.

16. The non-transitory computer-readable storage medium of claim 12, wherein the computer-executable instructions, in response to execution by the computing device, further cause the computing device to:
   when the cache coherence state of the block is identified as a shared state:
      identify a last time when the block was last accessed;
      calculate a difference between a current time and the last time; determine if the difference exceeds a threshold;
      disable the refresh of the directory entry stored in the DRAM when the difference is determined to exceed the threshold; and
      enable the refresh of the directory entry stored in the DRAM when the difference is determined not to exceed the threshold.

17. The non-transitory computer-readable storage medium of claim 12, wherein to refresh the directory entry, the computer-executable instructions, in response to execution by the computing device, cause the computing device to:
   charge one or more capacitors corresponding to the directory entry.

18. A multicore chip, comprising:
   a plurality of processor cores and a plurality of cache memories, wherein each cache memory of the plurality of cache memories corresponds to one or more of the plurality of processor cores;
   a directory stored in dynamic random access memory (DRAM), wherein the directory comprises a directory entry, the directory entry comprising a sharers item that identifies which of a plurality of cache memories in the multicore chip store a block associated with the directory entry, and an error correction code (ECC) for either or both detection and correction of an error in the sharers item; and
   a directory controller configured to:
      access the directory entry in the directory;
      detect the error in the sharers item based on the ECC;
      in response to a determination that the detected error is not correctable by use of the ECC:
         broadcast a message to each cache memory of the plurality of cache memories in the multicore chip, wherein the message requests each cache memory to determine if the corresponding cache memory contains the block;
         receive replies to the message; and
         update the sharers item to correct the detected error based on the received replies;
      identify the cache coherence state of the block associated with the directory entry; and
      selectively disable a refresh of the directory entry in the directory based on the identified cache coherence state of the block such that energy associated with the multicore chip is conserved.

19. The multicore chip of claim 18, wherein in being configured to selectively disable, the directory controller is configured to selectively disable the refresh of the directory entry when the cache coherence state of the block is identified as one of an exclusive state, a modified state, an invalid state, or an uncached state.

20. The multicore chip of claim 18, wherein the directory controller is further configured to:
   selectively enable the refresh of the directory entry when the cache coherence state of the block is identified as one of an exclusive state, a modified state, an invalid state, or an uncached state.

21. The multicore chip of claim 18, wherein the directory controller is further configured to:

selectively enable the refresh of the directory entry when the cache coherence state is identified as a shared state.

22. The multicore chip of claim 18, wherein the directory controller is further configured to:
when the cache coherence state of the block is identified as a shared state:
identify a last time when the block was last accessed;
calculate a difference between a current time and the last time; determine if the difference exceeds a threshold;
disable the refresh of the directory entry when the difference is determined to exceed the threshold; and
enable the refresh of the directory entry when the difference is determined not to exceed the threshold.

23. The multicore chip of claim 18, wherein to refresh the directory entry, the directory controller is further configured to:
charge of one or more capacitors corresponding to the directory entry.

* * * * *

UNITED STATES PATENT AND TRADEMARK OFFICE
CERTIFICATE OF CORRECTION

| | | |
|---|---|---|
| PATENT NO. | : 9,275,696 B2 | Page 1 of 1 |
| APPLICATION NO. | : 13/812967 | |
| DATED | : March 1, 2016 | |
| INVENTOR(S) | : Solihin | |

It is certified that error appears in the above-identified patent and that said Letters Patent is hereby corrected as shown below:

On the Title Page, in item (75), under "Inventor", in Column 1, Line 1, delete "Poway, CA (US)" and insert -- Raleigh, NC (US) --, therefor.

In the Specification

In Column 1, Line 8, delete "§371" and insert -- § 371 --, therefor.

In Column 15, Line 18, delete "machine Such" and insert -- machine. Such --, therefor.

In Column 15, Line 25, delete "machine The" and insert -- machine. The --, therefor.

Signed and Sealed this
Fourteenth Day of June, 2016

Michelle K. Lee
*Director of the United States Patent and Trademark Office*